United States Patent [19]
Lenz et al.

[11] Patent Number: 5,609,720
[45] Date of Patent: Mar. 11, 1997

[54] THERMAL CONTROL OF SEMICONDUCTOR WAFER DURING REACTIVE ION ETCHING

[75] Inventors: Eric H. Lenz, San Jose; Keith E. Dawson, Livermore, both of Calif.

[73] Assignee: Lam Research Corporation, Fremont, Calif.

[21] Appl. No.: 536,459

[22] Filed: Sep. 29, 1995

[51] Int. Cl.$^6$ ........................ H01L 21/00
[52] U.S. Cl. .................. 156/643.1; 156/345
[58] Field of Search ............... 156/345, 345 M, 156/345 C, 345 P, 626.1, 643.1, 662.1; 204/298.31, 298.33; 118/724; 219/121.43, 121.4, 121.44, 121.58

[56] References Cited

U.S. PATENT DOCUMENTS

| | | | |
|---|---|---|---|
| 4,275,289 | 6/1981 | Lord | 219/121 |
| 4,313,783 | 2/1982 | Davies et al. | 156/345 P X |
| 4,361,749 | 11/1982 | Lord | 219/121 |
| 4,384,918 | 5/1983 | Abe | 156/643 |
| 4,565,601 | 1/1986 | Kahehi et al. | 156/643 |
| 4,603,466 | 8/1986 | Morley | 29/569 |
| 4,859,304 | 8/1989 | Cathey et al. | 204/298 |
| 4,971,653 | 11/1990 | Powell et al. | 156/626 |
| 5,002,631 | 3/1991 | Glapis et al. | 156/643 |
| 5,009,738 | 4/1991 | Gruenwald et al. | 156/345 |
| 5,021,139 | 6/1991 | Hartig et al. | 204/298.09 |
| 5,131,460 | 7/1992 | Krueger | 165/80.2 |
| 5,147,498 | 9/1992 | Nashimoto | 156/647 |
| 5,155,331 | 10/1992 | Horiuchi et al. | 219/121.43 |
| 5,203,958 | 4/1993 | Arai et al. | 156/643 |
| 5,221,403 | 6/1993 | Nozawa et al. | 156/345 |
| 5,230,741 | 7/1993 | van de Ven et al. | 118/728 |
| 5,248,370 | 9/1993 | Tszi et al. | 156/345 |
| 5,310,453 | 5/1994 | Fakasawa et al. | 156/643 |
| 5,356,476 | 10/1994 | Foster et al. | 118/725 |
| 5,382,311 | 1/1995 | Ishikawa et al. | 156/345 |

*Primary Examiner*—William Powell
*Attorney, Agent, or Firm*—Irwin Ostroff; Edward P. Brandeau

[57] ABSTRACT

Apparatus and method for obtaining improved control of the temperature of a semiconductor wafer over its area during plasma processing including reactive ion etching (RIE) and similar processing. RIE reactor apparatus is provided with a novel chuck arrangement both for holding and for controlling the temperature of a wafer during processing. A top face of a chuck (either mechanical or electrostatic), against which the wafer is held, is configured into a plurality of zones into which zone coolant gas, such as helium, is admitted. The zone coolant gas passes through narrow channels between the top face of the chuck and the Underside of the wafer. Heat transfer from the wafer through the zone coolant gas and to the body of the chuck is controlled zone by zone by separately setting the pressure of zone coolant gas in each of the zones. By properly choosing pressures of zone coolant gas in the respective zones the temperature across the area from the center to the rim of both small and large diameter wafers (e.g., 8 inches) can be held substantially constant even though power dissipation per unit of area within the wafer during processing varies considerably from the center to the rim.

17 Claims, 4 Drawing Sheets

THERMAL CONTROL OF SEMICONDUCTOR WAFER DURING REACTIVE ION ETCHING

FIELD OF THE INVENTION

This invention relates to apparatus and method for obtaining improved control of the temperature of a semiconductor wafer over its area during processing including reactive ion etching (RIE) and similar processing.

BACKGROUND OF THE INVENTION

The fabricating and processing of semiconductor wafers to produce individual integrated circuits (IC's) is well known in the art. In one widely used manufacturing method a wafer (e.g., an eight inch diameter, silicon wafer) is chemically and photographically processed through a number of steps to produce a multitude of very closely spaced and precisely detailed IC's on the wafer. As part of its processing, a wafer may be exposed within a reactor to a highly active plasma of special gas or gases in order to etch, by means of reactive ions of the gases, very fine details (lines, zones, etc.) into a top surface of a wafer being processed. The wafer is subsequently cut into individual IC's. This general technology is well known in the art and need not be described further.

A typical plasma etching apparatus comprises a reactor in which there is a chamber through which reactive gas or gases are flowed. Within the chamber the gases are ionized into a plasma, typically by radio frequency energy. The highly reactive ions of the plasma gas are able to react with material, such as a polymer mask on a surface of a semiconductor wafer being processed into IC's. Prior to etching, the wafer is placed in the chamber and held in proper position by a chuck or holder which exposes a top surface of the wafer to the plasma gas. There are several types of chucks (also sometimes called susceptors) known in the art. The chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer. The present invention is applicable to both types of chucks.

During etching in a typical plasma etching operation, the reactive ions of the plasma gas chemically react with portions of material on a face of the semiconductor wafer. Some processes are exothermic and cause some degree of heating of the wafer, but most of the heating is caused by the plasma. The chemical reaction between gas (ions and radicals) and wafer material, on the other hand, is accelerated to some degree by the temperature rise of the wafer. Local wafer temperature and rate of chemical reaction at each microscopic point on the wafer are related to an extent that harmful unevenness in etching of material over a face of the wafer can easily result if the temperature of the wafer across its area varies too much. In most cases it is highly desirable that etching be uniform to a nearly perfect degree since otherwise the IC's being fabricated will have electronic characteristics which deviate more than is desirable. Furthermore, with each new increase in the size of wafer diameter, going from four inch to six, to eight and in the near future to twelve inch diameter, the problem of insuring uniformity of each batch of IC's from larger and larger wafers becomes more difficult.

The problem of temperature rise of a wafer during reactive ion etching (RIE) is well known, and various attempts in the past to control the temperature of a wafer during etching have been tried. One previous way to control wafer temperature during RIE has been to admit coolant gas (such as helium) at a single pressure within a single thin space between the bottom of the wafer and the top of the chuck which holds the wafer. However, past arrangements of this sort have not been entirely effective in adequately controlling rises and variations in wafer temperature. This is particularly so with larger diameter wafers. It is desirable therefore to provide apparatus and method for improved control of temperature of semiconductor wafers during RIE and similar processes.

SUMMARY OF THE INVENTION

The present invention is directed in one aspect to a reactor apparatus having a novel chuck arrangement both for holding and for controlling the temperature of a workpiece (e.g., a semiconductor wafer) during plasma processing such as plasma etching. A top face of the chuck arrangement is configured into a plurality of zones into which zone coolant gas, such as helium, is admitted. A semiconductor wafer to be plasma processed is typically held against the top face of the chuck arrangement by either mechanical or electrostatic) means. The zone coolant gas passes through narrow channels or holes between the top face of the chuck and the underside of the wafer. Heat transfer from the wafer through the zone coolant gas and to the body of the chuck is controlled zone by zone by separately setting the pressure and controlling the in or out flow of zone coolant gas in each of the zones. By properly controlling the in or out flow of gas in each zone the respective pressures chosen can be maintained. At properly chosen pressures of zone coolant gas in the respective zones, the temperature across the area from the center to the rim of both small and large diameter wafers (e.g., 8 inches, 12 inches) can be held substantially constant even though power dissipation per unit of area within the wafer during processing varies considerably from the center to the rim.

Viewed from another aspect, the present invention is directed to apparatus for controlling temperature across a workpiece during processing. The apparatus comprises reactor means useful for applying energetic gas to the surface of a workpiece during processing, and temperature control means. The temperature control means holds the workpiece within the reactor means during processing and selectively transfers heat away from the workpiece over the area therein and comprises chuck means and gas pressure sensing, control and supply means. The chuck means has a top face for holding the workpiece during processing, the top face defining a plurality of separate zones into which zone coolant gas may be admitted at pre-determined pressures and flow rates between the top face of the chuck means and the underside of the workpiece. The gas pressure sensing, control and supply means supplies zone coolant gas with separate pressures to the plurality of zones whereby the temperature across a workpiece is controlled during processing.

Viewed from another aspect, the present invention is directed to a combination of chuck and cooling means and gas pressure sensing and flow control means. The chuck and cooling means is useful in reactor apparatus for processing workpieces and is adapted for both holding and for controlling the temperature of a workpiece during processing. The chuck and cooling means has a top face on which the workpiece is placed during processing and has a plurality of concentric zones into which zone coolant gas is admitted under respective pressures and flows along an underside of the workpiece. The gas pressure sensing and flow control means supplies zone coolant gas to each of the zones, the pressures and flow rates of gases in the respective zones are determined in accordance with a desired profile of temperature across the workpiece during processing so as to control the temperature across a workpiece during processing thereof.

Viewed from another aspect, the present invention is directed to apparatus for processing workpieces. The apparatus comprises a reactor housing, a plasma confinement chamber in which a workpiece can be reaction ion etched, a chuck, and zone coolant gas means. The chuck holds a workpiece in the chamber during processing and has a top face upon which the workpiece is held. The top face is configured into a plurality of zones into which zone coolant gas can be admitted beneath the workpiece, and zone coolant gas means. The zone coolant gas means is connected to each of the zones to supply the gas at controlled pressures to the respective zones, the pressures and flow rates of the gas supplied to the respective zones being controlled so as to control temperature across the workpiece during processing.

Viewed from still another aspect, the present invention is directed to a method for controlling temperature across workpieces during processing thereof. The method comprises a first step of holding a workpiece during processing against a top face of a chuck in a reactor chamber, a second step of configuring the top face into a plurality of zones into which zone coolant gas can flow along and between the top face and an underside of the workpiece; a third step of admitting of a cooling gas into the respective zones; and a fourth step of controlling the pressures of zone coolant gas separately in the respective zones so as to control the temperature across a workpiece during processing.

Viewed from still another aspect, the present invention is directed to a method for controlling the temperature across a workpiece during processing. The method comprises a first step of holding the workpiece on a chuck in a chamber of a reactor during processing. The chuck has a top face on which the workpiece is held and the face is configured into a plurality of zones into which zone coolant gas is admitted. The gas in the zones is present between the top face and underside portions of the workpiece. A second step of the method is supplying zone coolant gas into each of the zones; and a third step of the method is controlling the pressures of the gas in the respective zones. The pressure of gas is higher in a zone beneath a portion of the workpiece with higher power dissipation, and lower in a zone beneath a portion of the workpiece with lower power dissipation such that temperature differences across the workpiece are controlled.

A better understanding of the invention will best be gained from a study of the following description and claims.

DETAILED DESCRIPTION

Figure 1:
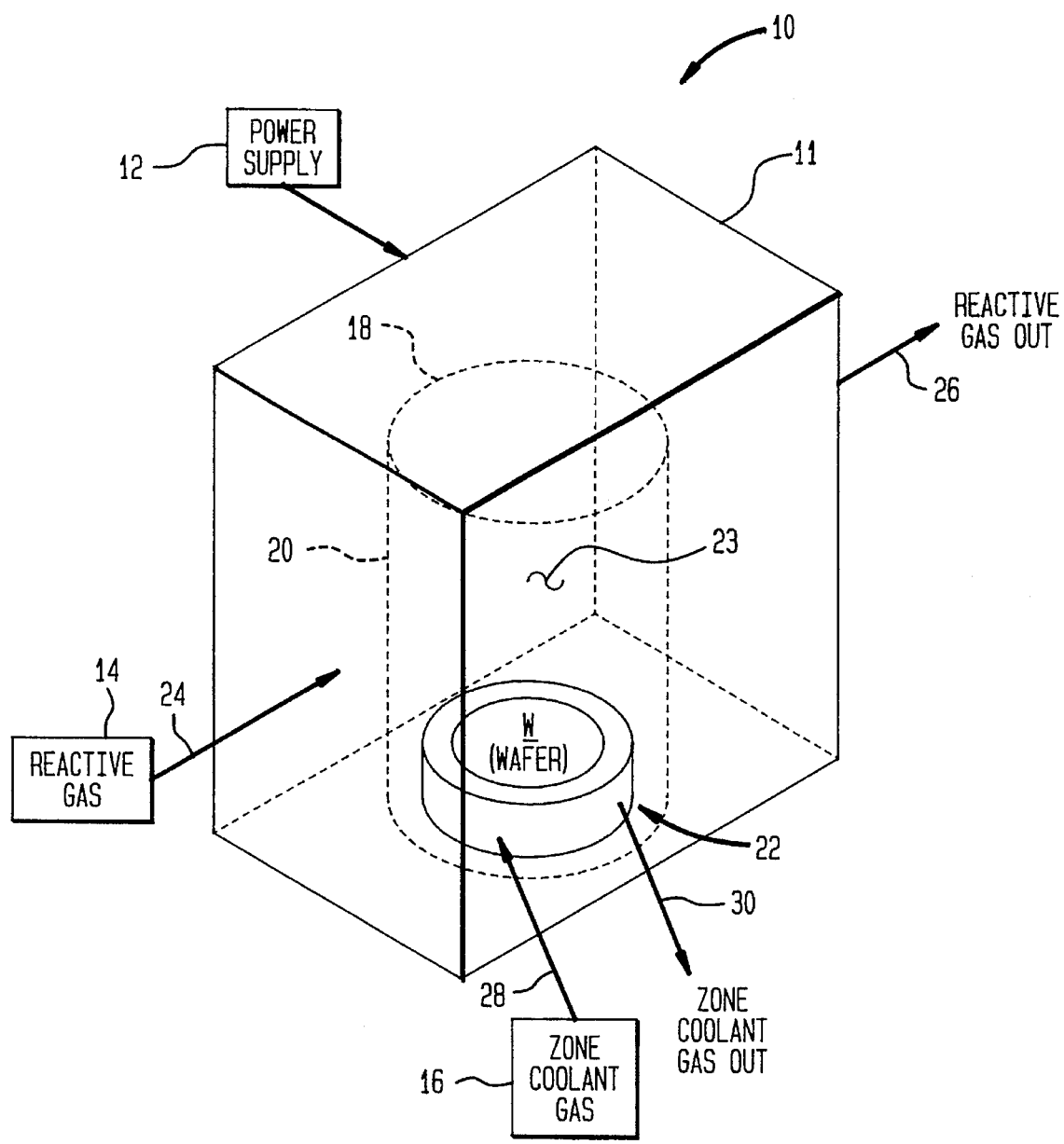
FIG. 1 is a schematic representation of reactor apparatus for RIE and similar processing of semiconductor wafers, the reactor having within it a wafer-holding chuck with improved temperature control provided in accordance with the present invention.

Referring now to FIG. 1, there is shown schematically a reactor apparatus 10 for reactive ion etching (RIE) and similar processing of workpieces (e.g., semiconductor wafers) in accordance with the present invention. Apparatus is shown with a semiconductor wafer (work piece) W therein. Certain elements of reactor apparatus 10 are shown schematically (or not at all) and the general structure and operation of the reactor apparatus 10 may be similar to certain ones commercially available from the Lam Research Corp., for example The reactor apparatus 10 has a housing 11, a power supply 12, a reactive gas supply 14, a zone coolant gas supply 16, a top electrode 18 (shown in dashed outline), a plasma confinement chamber 20 (shown in dashed outline), and a chuck 22, provided according to one aspect of the invention, for holding and for controlling the temperature of a wafer W during processing. The chuck 22 also serves as a bottom electrode which in conjunction with the top electrode 18 during RIE processing of the wafer W generates a plasma 23 within the chamber 20. Reactive gas or gases, at controlled pressure, temperature, and flow rate, are introduced into the housing 11 from the reactive gas supply 14 via a tube 24 and the gases are exhausted from housing 11 via a tube 26. Zone coolant gas, at controlled pressure, is applied from the zone coolant gas supply 16 to the chuck 22 via a tube 28 and is bled from the chuck 22 via a vacuum line 30. The chuck 22 is maintained at a desired constant temperature by suitable means (not shown).

Figure 2:
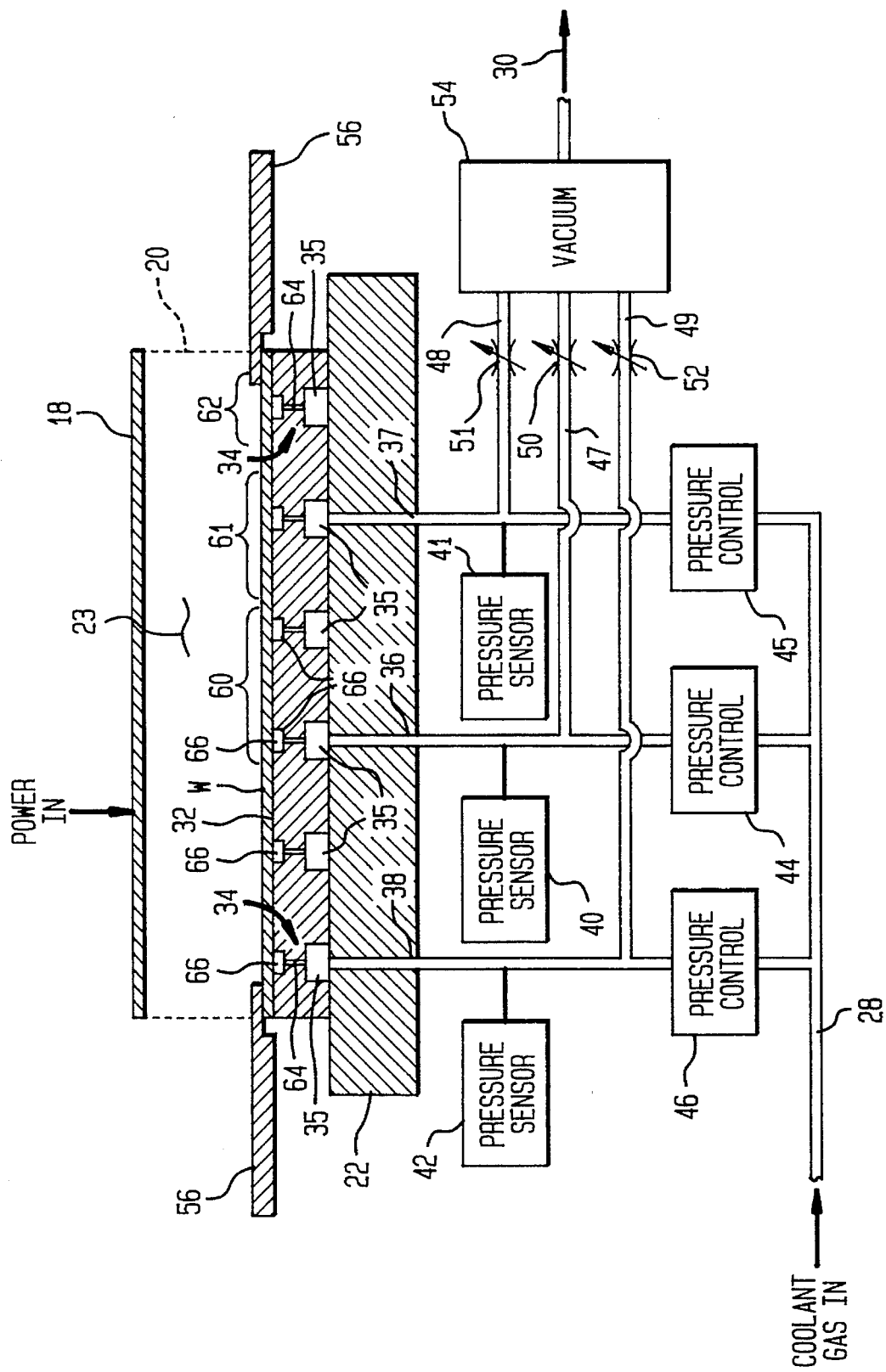
FIG. 2 is an enlarged schematic side view of portions of the reactor apparatus of FIG. 1 showing additional details of the chuck and wafer and an improved temperature control arrangement in accordance with the present invention.

Referring now to FIG. 2, there is shown a somewhat enlarged schematic side view of the chuck 22 of FIG. 1 showing one illustrative embodiment of a temperature-controlling arrangement for a wafer W in accordance with the present invention. Chuck 22 comprises a top face 32, a plurality of zone coolant gas passage arrangements generally indicated at 34, a plurality of zone coolant gas manifolds generally indicated at 35, zone coolant gas feed lines 36, 37, and 38, separate gas pressure sensors 40, 41, and 42 for the lines 36, 37, and 38, respectively, separate pressure control valves 44, 45, and 46, for the lines 36, 37, and 38 respectively, and which are supplied in common with zone coolant gas from the input line 28, and gas bleed lines 47, 48 and 49 which are connected to the lines 36, 37, and 38, respectively, and through respective ones of adjustable valves 50, 51, and 52 to a vacuum sump 54 which is connected to the vacuum line 30. Pressure control valves 44, 45, 46 can increase or decrease their respective gas flows to keep the pressures at sensors 40, 41, and 42 at desired values. This compensates for gas admitted to or removed from coolant zones shortly to be described. The wafer W is clamped against the top face 32 of the chuck 22 by a circular clamp ring 56 engaging the wafer W around its rim and applying a suitable downward force. The face 32 of the chuck 22 is approximately the same diameter as that of the wafer W, is slightly dome-shaped, that is, spherical with a suitable radius of curvature. By way of a typical example, the diameter of the face 32 of the chuck 22 is about 8 inches and is made of polished, anodized aluminum. The radius of curvature of the face 32 is about 225 inches. While clamped against the chuck 22, the underside of the wafer W is thus in close contact with the top face 32. As so positioned, the top of the wafer W is exposed during processing to the reactive ion plasma 23 within the chamber 20 between the top electrode 18 and the chuck 22, which also serves as the bottom electrode.

Figure 3:
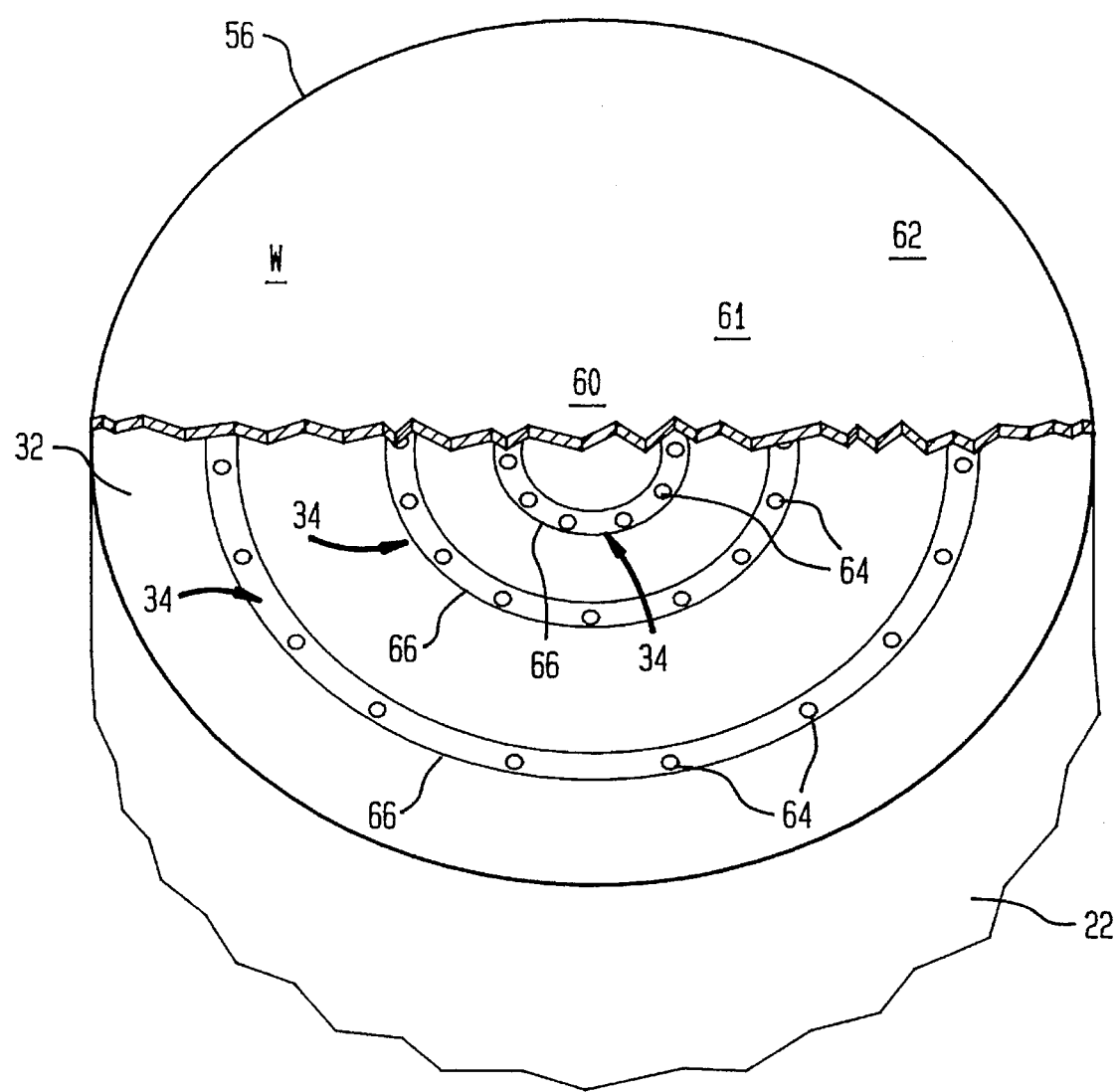
FIG. 3 is a schematic perspective view partially broken away showing details of the top face of the chuck of FIG. 2.

Referring now to FIG. 3, there is shown a broken-away schematic view of a typical embodiment of the top face 32 of the chuck 22 which is divided into three circular coolant zones indicated at 60 (zone 1), 61 (zone 2), and 62 (zone 3). A portion of a semiconductor wafer W is shown on top face 32. A respective set of the gas passage arrangements 34 is associated with each of the zones 60, 61, and 62. Each of the gas passage arrangements 34 comprises a series of small diameter holes 64 arranged in a circular pattern within a respective zone. The holes 64 pass up through the top face 32 and open into a respective zone. The holes 64 pass down through the top face 32 and open into a respective one of the gas manifolds 35 (seen only in FIG. 2). These manifolds 35 are circular and lie underneath the zones 1, 2, and 3 respectively. Concentric with each circular set of the holes 64 is a respective thin, shallow groove 66 (see also FIG. 2) in the top face 32. The grooves 66 provide for easy circumferential flow of zone coolant gas beneath the wafer W and the top face 32 of the chuck 22 in each of the zones 1, 2, and 3. Zone coolant gas passes freely into the grooves 66 up through the holes 64, and may be exhausted down through these holes 64 in accordance with the pressure settings respectively in each of the zones 60, 61, and 62. The respective gas passage arrangements 34 are configured so that pressure can be controlled within each of the three zones (1, 2, and 3), as will be explained in detail shortly. By having a plurality of zones, the temperature of the wafer W across its area from the center to its rim is much more effectively controlled during processing than if only a single zone of zone coolant gas at a single pressure were used.

Referring again to FIG. 2, zone coolant gas at controlled pressure is supplied to or removed from zone 1 (also indicated at 60) from the supply line 28 through the pressure control value 44, the feed line 36 and the vacuum line 47 and a respective one of the gas passage arrangements 34 and manifolds 35. Similarly, zone coolant gas is separately supplied to or removed from zone 2 (61) via a respective one of gas passage arrangements 34 and manifolds 35, the feed line 37 and the pressure control valve 45 from the zone coolant gas supply line 28 and the vacuum line 48. And zone 3 (62) is supplied via a respective one of gas passage arrangements 34 and manifolds 35, the feed line 38, and the pressure control valve 46 from the supply line 28, and gas is removed by the line 49. During operation, pressure in each of the feed lines 36, 37, and 38 is sensed by a respective one of the pressure sensors 40, 41, and 42. Through respective feedback control circuits (not shown), the separate pressures measured by the sensors 40, 41, and 42 are used to regulate the respective pressure control valves 44, 45 and 46 and hence the individual pressures in the feed lines 36, 37, and 38. Excess zone coolant gas is bled from the lines 36, 37, and 38, and the zones 1, 2, and 3 by the bleed lines 47, 48, and 49 through the respective valves 50, 51, and 52, which may be individually set, to the vacuum sump 54. Thus by setting the pressure sensors 40, 41, and 42 to desired values, and adjusting the bleed valves 50, 51, and 52, the zone coolant gas in each of the three zones 60, 61, and 62 has a separately controlled pressure. Since heat transfer from the wafer W through the zone coolant gas and to the top face 32 of the chuck 22 depends upon the pressure of the gas, control of the temperature of the wafer W can be independently controlled within each of the zones 1, 2, and 3 across the area of the wafer. A small amount of zone coolant gas may flow from one zone to another in a radial direction relative to the top face 32 and beneath the wafer W, but this does not appreciably affect the respective gas pressures by virtue of the differential addition or removal of gas in the individual zones.

Figure 4:
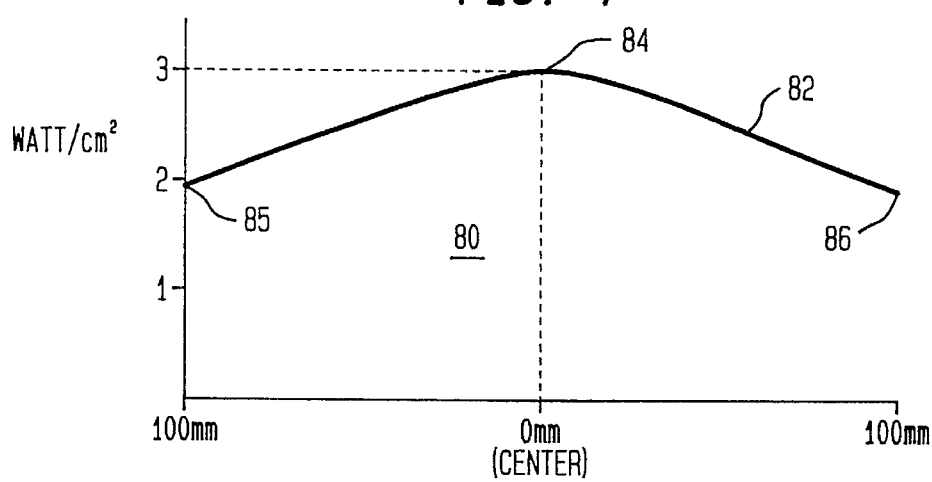
FIG. 4 is a graph showing variation in power dissipation across the diameter of a semiconductor wafer of 200 millimeters diameter.

Referring now to FIG. 4, there is shown, by way of example, a graph 80 of power dissipation per unit of area (Watt/cm$^2$) shown on the y-axis versus distance across a 200 millimeter diameter wafer W (about 8 inches in diameter) from its center at "0" to its rim at 100 mm as shown on the x-axis. The graph 80 is typical of results of some prior arrangements used in plasma processing reactors. A curved line 82 shows at its center 84 (corresponding to the center of the wafer W) a power dissipation in the wafer W of 3 watts/cm$^2$. At diametrically opposite ends 85 and 86 of the line 82 (corresponding to the rim of the wafer W) the dissipation drops off to 2 watts/cm$^2$ This sort of variation in power dissipation in a wafer W can occur as a result of variations in etching of the wafer W by the reactive ions of a gas plasma.

Figure 5:
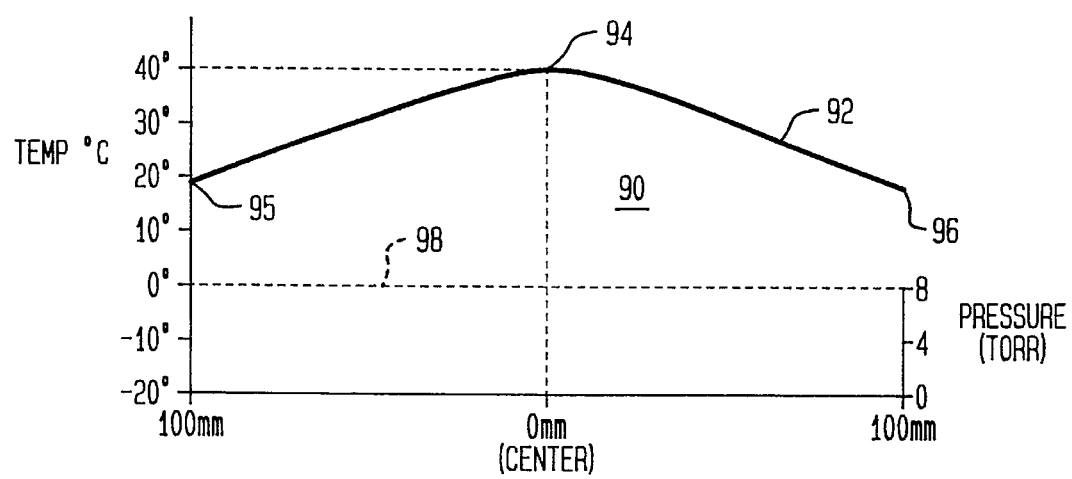
FIG. 5 is a graph illustrating prior-art control of temperature variation across the diameter of a wafer for the power dissipation conditions illustrated in FIG. 4 and with cooling of the underside of the wafer by helium gas at a single pressure (8 Torr)

Referring now to FIG. 5, there is shown a graph 90 of differential temperature rise in degrees centigrade (Temp °C.) on the y-axis versus distance across the diameter of the wafer W as indicated on the x-axis. The temperature rise in the wafer W corresponds to the power dissipation conditions illustrated in FIG. 4 and with cooling of the wafer W by zone coolant gas between the wafer W and a chuck in a single zone at a uniform pressure of 8 Torr as is typical of prior art plasma processing reactors. A curved line 92 in the graph 90 shows at its center 94 (corresponding to the center of the wafer W), a temperature rise of 40° C. above ambient (ambient being indicated at 0° C. on the left hand scale). At diametrically opposite ends 95 and 96 of the line 92 (corresponding to the rim of the wafer W), the temperature rise is only 20° C. because of lower power dissipation per unit of area at the rim of the wafer W (see FIG. 4). Pressure in a single zone of zone coolant gas (helium) between a chuck face and the underside of the wafer W is uniformat 8 Torr (right hand scale) as indicated by the dashed line 98. As was explained previously, substantial variation in temperature, such as shown by the curved line 92 in FIG. 5, across a wafer W during processing is undesirable.

Figure 6:
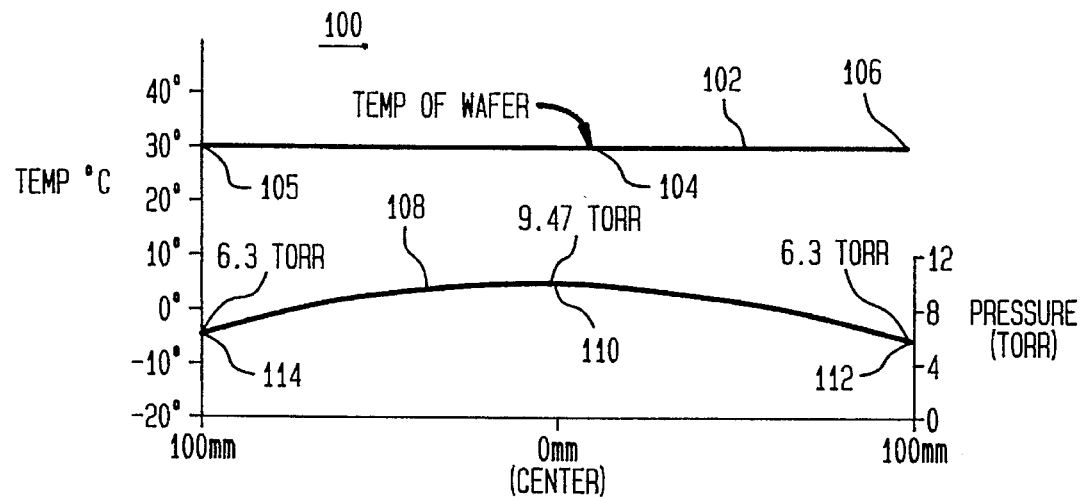
FIG. 6 is a graph illustrating improved temperature control of the wafer for the power dissipation conditions of FIG. 4, but with cooling of the underside of the wafer by helium gas with a pressure which is varied underneath the wafer across its diameter in accordance with the present invention.

Referring now to FIG. 6, there is shown a graph 100 which results from the use of multiple-zone cooling of the wafer W in accordance with principles of the present invention and which gives greatly improved temperature control across the wafer W for the power dissipation conditions illustrated in FIG. 4. A relatively straight line 102 of graph 100 shows that temperature rise across the wafer W from its center at 104 to its diametrically opposite ends 105 and 106 is held constant at 30° C. A curved line 108 of graph 100 shows at its center 110 a pressure of helium zone coolant gas between the wafer W and a chuck, such as the chuck 22 of FIGS. 2 and 3, of 9.47 Torr and at its diametrically opposite ends 111 and 112 a pressure of 6.3 Torr. The curved line 110 is a "best fit" line showing a zone coolant gas pressure of about 9.5 Torr in a center zone corresponding to the zone 1 (60), a pressure of about 8 Torr in an intermediate zone corresponding to the zone 2 (61), and a pressure of about 6.5

Torr in an outer zone corresponding to the zone 3 (62). This is a variation in gas pressure of almost two to one. By controlling the pressures of the zone coolant gas in the respective zones as indicated by the line 108, the temperature across the wafer W from its center to its rim can be held at a substantially constant temperature (e.g., 30° C. above ambient) in spite of a large difference in power dissipation in the wafer W such as illustrated in FIG. 4. By way of example, flow of helium zone coolant gas in each of the respective zones 1, 2, and 3 can be up to about 100 standard cubic centimeters per minute (SCCM). Of course, for a different distribution of power dissipation from that illustrated in FIG. 4, the respective pressures in the plurality of cooling zones (e.g., zones 1, 2, and 3) can be adjusted in accordance with a desired temperature distribution across the wafer W. In this way processing of IC's on the wafer W is made much more nearly uniform than if only a single zone with zone coolant gas at a single pressure were used for temperature control. This is particularly true for larger diameter wafers (e.g., 8 inches and larger).

Various modifications in the apparatus and method disclosed may occur to those skilled in the art and can be made without departing from the spirit and scope of the invention as set forth in the accompanying claims. For example, the configuration of the zone coolant gas zones may be changed and the number of zones is not limited to only three zones. Further, zone coolant gas other than helium may be used and gas pressures, flows and temperature may be different from those described. Moreover, the invention is not limited to a particular process of RIE, or to a particular diameter of semiconductor wafer, or to a particular kind of chuck. Furthermore, the workpiece can be other than a circular semiconductor wafer. It can be a rectangular wafer, a rectangular flat screen display, a magnetic core device, or a variety of other objects of regular or irregular shapes.

What is claimed is:

1. Apparatus for controlling temperature across a workpiece during processing, the apparatus comprising:

reactor means useful for applying energetic gas to the surface of a workpiece during processing; and temperature control means for holding the workpiece within the reactor means during processing and for selectively transferring heat away from the workpiece over the area therein, said temperature control means comprising:

chuck means having a top face for holding the workpiece during processing, the top face defining a plurality of separate zones into which zone coolant gas may be admitted at pressures between the top face of the chuck means and the underside of the workpiece; and gas pressure sensing, control and supply means for supplying zone coolant gas with separate pressures to the plurality of zones whereby the temperature across a workpiece is controlled during processing.

2. The apparatus of claim 1 wherein the workpiece is a semiconductor wafer which is reactive ion etched during processing.

3. The apparatus of claim 1 wherein each of the zones is circular and has a respective zone coolant gas passage arrangement comprising:

the top face defining a plurality of holes therethrough arranged in a circular pattern;

the top face defining at least one thin shallow circular groove therein on top of the holes so as to provide for easy flow of zone coolant gas in a circular direction along the underside of the wafer; and supply manifold means in communication with the holes in each zone for supplying same with zone coolant gas of regulated pressure.

4. The apparatus of claim 3 wherein the top face is anodized aluminum and is in close contact with the wafer substantially over its area, and heat from the wafer is transferred by the zone coolant gas in each zone to the top face, and the temperature across the wafer is held substantially uniform.

5. In combination:

chuck and cooling means useful in reactor apparatus for processing workpieces, the chuck and cooling means being adapted for both holding and for controlling the temperature of a workpiece during processing, the chuck and cooling means having a top face on which the wafer is placed during processing and having a plurality of concentric zones into which zone coolant gas is admitted under respective pressures along an underside of the workpiece; and gas pressure sensing and flow control means for supplying zone coolant gas to each of the zones, the pressures of gases in the respective zones being determined in accordance with a desired profile of temperature across the workpiece during processing so as to control the temperature across a workpiece during processing thereof.

6. The chuck and cooling means of claim 5 in which each of the zones defines at least one shallow circular channel in the top face with a plurality of gas inlet and outlet holes therethrough, the holes being supplied with zone coolant gas by the gas pressure sensing and flow control means.

7. The chuck and cooling means of claim 6 wherein there are three concentric zones, and the pressures of zone coolant gas change from zone to zone from a center of a wafer to a rim thereof.

8. The apparatus of claim 5 in which the zone coolant gas is helium, and the pressures of zone coolant gas are changed from an inner zone to an outer zone from about 10 Torr to about 6 Torr such that the temperature across a wafer being processed is essentially uniform.

9. The apparatus of claim 5 wherein the workpieces are semiconductor wafers.

10. Apparatus for processing workpieces comprising:

a reactor housing;

a plasma confinement chamber in which a workpiece can be reaction ion etched;

a chuck for holding a workpiece in the chamber during processing, the chuck having a top face upon which the workpiece is held, the top face being configured into a plurality of zones into which zone coolant gas can be admitted beneath the workpiece; and zone coolant gas means connected to each of the zones to supply the gas at controlled pressures to the respective zones, the pressures and flow rates of the gas supplied to the respective zones being controlled so as to control temperature across the workpiece during processing.

11. The apparatus of claim 10 wherein the flow of gas into the respective zones is up to about 100 standard cubic centimeters per minute, and the pressures of the gas in the zones vary over a range of about two to one, and the temperature across the workpiece is held substantially uniform.

12. A method for controlling temperature across workpieces during processing thereof comprising the steps of:

holding a workpiece during processing against a top face of a chuck in a reactor chamber;

configuring the top face into a plurality of zones into which zone coolant gas can flow along and between the top face and an underside of the workpiece;

admitting of a cooling gas into the respective zones; and controlling the pressures of zone coolant gas separately in the respective zones so as to control the temperature across a workpiece during processing.

13. The method of claim 12 in which the top face is provided with a plurality of concentric circular zones and each zone is supplied with a separate flow of zone coolant gas at a controlled pressure.

14. The method of claim 13 wherein the top face is provided with at least three zones, each of which includes a thin narrow channel in the top face with a circular pattern of small gas inlet holes, and wherein helium gas is supplied to the holes of the respective zones at pressures in the ranges from about 6 Torr to about 10 Torr.

15. The method of claim 12 wherein the workpieces are semiconductor wafers.

16. A method of controlling the temperature across a workpiece during processing comprising the steps of:

holding the workpiece on a chuck in a chamber of a reactor during processing, the chuck having a top face on which the workpiece is held, the top face of the chuck being configured into a plurality of zones into which zone coolant gas is admitted, the gas in the zones flowing between the top face and underside portions of the workpiece;

supplying zone coolant gas into each of the zones; and controlling the pressures of the gas in the respective zones, the pressure of gas being higher in a zone beneath a portion of the workpiece with higher power dissipation, and lower in a zone beneath a portion of the workpiece with lower power dissipation such that temperature differences across the workpiece are controlled.

17. The method of claim 16 wherein the processing is plasma processing and the workpiece is a semiconductor wafer.

* * * * *